United States Patent
Chen et al.

(10) Patent No.: US 12,203,019 B2
(45) Date of Patent: Jan. 21, 2025

(54) NANOPARTICLE HAVING DISSOCIABLE PROTECTIVE GROUP, NANOPARTICLE LAYER PATTERNING METHOD AND RELATED APPLICATION

(71) Applicants: Beijing BOE Technology Development Co., Ltd., Beijing (CN); BOE Technology Group Co., Ltd., Beijing (CN)

(72) Inventors: Zhuo Chen, Beijing (CN); Tieshi Wang, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/490,221

(22) Filed: Oct. 19, 2023

(65) Prior Publication Data

US 2024/0059963 A1     Feb. 22, 2024

Related U.S. Application Data

(63) Continuation of application No. 17/351,376, filed on Jun. 18, 2021, now Pat. No. 11,851,593.

(30) Foreign Application Priority Data

Nov. 30, 2020 (CN) .......................... 202011376226.3

(51) Int. Cl.
  *C09K 11/06*   (2006.01)
  *B82Y 20/00*   (2011.01)
  (Continued)

(52) U.S. Cl.
  CPC ............ *C09K 11/06* (2013.01); *G03F 7/0042* (2013.01); *H10K 50/115* (2023.02); *H10K 71/00* (2023.02); *B82Y 20/00* (2013.01); *B82Y 40/00* (2013.01)

(58) Field of Classification Search
  CPC ..... C09K 11/06; C09K 11/025; C09K 11/883; G03F 7/0042; G03F 7/004; H10K 50/115;
  (Continued)

(56) References Cited

U.S. PATENT DOCUMENTS 6,310,189 B1 *  10/2001 Fodor .................. C07C 229/14
                                            536/25.31
6,506,558 B1 *  1/2003 Fodor ................ G11C 13/0019
                                            506/16

(Continued)

FOREIGN PATENT DOCUMENTS

CN     102782580 A     11/2012
CN     110289363 A      9/2019
(Continued)

OTHER PUBLICATIONS

CN202011376226.3 first office action.
(Continued)

*Primary Examiner* — Caleb E Henry
(74) *Attorney, Agent, or Firm* — IPro, PLLC

(57) ABSTRACT

The present disclosure discloses a nanoparticle having a ligand with a changeable polarity, a nanoparticle layer patterning method and related application. When the nanoparticle disclosed by the present disclosure is adopted to form a patterned nanoparticle layer on a substrate, a photosensitive material is added in the nanoparticle, then a protective group in a first ligand is dissociated to form an amino under the irradiation of light with a preset wavelength, a second ligand including an amino is formed on a surface of (Continued)

a nanometer particle, and a polarity of the second ligand is different from a polarity of the first ligand; and the amino of the second ligand is cross-linked with an adjacent nanoparticle.

17 Claims, 10 Drawing Sheets

(51) Int. Cl.
  *B82Y 40/00* (2011.01)
  *G03F 7/004* (2006.01)
  *H10K 50/115* (2023.01)
  *H10K 71/00* (2023.01)
(58) Field of Classification Search
  CPC .......... H10K 71/00; H10K 71/421; H10K 2102/331; H10K 71/211; B82Y 20/00; B82Y 40/00; B82Y 30/00; G09F 9/33
  See application file for complete search history.

(56) References Cited

U.S. PATENT DOCUMENTS

| | | | | |
|---|---|---|---|---|
| 7,294,449 | B1* | 11/2007 | Gudeman | G03F 7/0047 430/270.1 |
| 8,343,627 | B2* | 1/2013 | Zhong | G01N 33/54326 428/403 |
| 9,812,004 | B1* | 11/2017 | Boshernitzan | G08C 17/02 |
| 9,831,706 | B2* | 11/2017 | MacWilliams | H02J 7/32 |
| 9,874,693 | B2* | 1/2018 | Baiocco | H01L 21/762 |
| 9,943,840 | B2* | 4/2018 | Shaffer | B01J 23/06 |
| 10,246,633 | B2* | 4/2019 | Pillay Narrainen | H05B 33/20 |
| 2007/0134699 | A1* | 6/2007 | Glover, III | B01J 19/0046 977/924 |
| 2008/0018886 | A1* | 1/2008 | Wisnudel | G11B 23/286 356/237.1 |
| 2010/0068522 | A1* | 3/2010 | Pickett | B82Y 30/00 977/773 |
| 2010/0113813 | A1* | 5/2010 | Pickett | C09C 3/08 977/774 |
| 2010/0213438 | A1* | 8/2010 | Cho | H10K 50/156 438/47 |
| 2011/0006269 | A1* | 1/2011 | Petruska | C01G 15/00 977/773 |
| 2011/0037029 | A1* | 2/2011 | Liu | C08G 65/3322 252/500 |
| 2011/0287566 | A1 | 11/2011 | Jang et al. | |
| 2011/0294995 | A1* | 12/2011 | Huo | B82Y 30/00 977/773 |
| 2012/0270231 | A1* | 10/2012 | Smith | C09K 11/02 435/7.1 |
| 2012/0280345 | A1* | 11/2012 | Zhu | G02B 6/1226 257/E31.127 |
| 2013/0004522 | A1* | 1/2013 | Dvir | A61K 9/5138 424/178.1 |
| 2013/0078389 | A1 | 3/2013 | Nara et al. | |
| 2013/0146854 | A1* | 6/2013 | Dong | H10K 50/12 438/45 |
| 2013/0345458 | A1* | 12/2013 | Freeman | C08G 77/38 556/439 |
| 2014/0027816 | A1* | 1/2014 | Cea | H01L 29/1054 257/E29.085 |
| 2014/0197507 | A1* | 7/2014 | Assefa | H01L 31/0745 438/69 |
| 2015/0031217 | A1* | 1/2015 | Naasani | C09K 11/883 438/780 |
| 2015/0091093 | A1* | 4/2015 | Bouche | H01L 29/45 257/369 |
| 2015/0267106 | A1* | 9/2015 | Pillay Narrainen | H01L 33/502 252/301.36 |
| 2015/0268417 | A1* | 9/2015 | Assefa | H01L 27/1461 385/14 |
| 2015/0275078 | A1* | 10/2015 | Vo | C09K 11/70 252/301.36 |
| 2018/0205020 | A1* | 7/2018 | Swager | C07D 405/14 |
| 2018/0298154 | A1* | 10/2018 | Lundorf | C04B 35/48 |
| 2019/0207136 | A1 | 7/2019 | Chen et al. | |
| 2019/0302615 | A1* | 10/2019 | Krysak | G03F 7/0043 |
| 2020/0131435 | A1* | 4/2020 | Pousthomis | B01J 19/06 |
| 2020/0303650 | A1 | 9/2020 | Kawakami | |
| 2021/0179939 | A1* | 6/2021 | Stokes | C09K 11/565 |
| 2022/0165952 | A1 | 5/2022 | Mei | |

FOREIGN PATENT DOCUMENTS

| | | |
|---|---|---|
| CN | 111433675 A | 7/2020 |
| CN | 112410019 A | 2/2021 |

OTHER PUBLICATIONS

CN202011376226.3 second office action.
U.S. Appl. No. 17/351,376 Non-Final Rejection Feb. 16, 2023.
U.S. Appl. No. 17/351,376 Notice of Allowance Aug. 24, 2023.

* cited by examiner

NANOPARTICLE HAVING DISSOCIABLE PROTECTIVE GROUP, NANOPARTICLE LAYER PATTERNING METHOD AND RELATED APPLICATION

This application is a continuation of U.S. patent application Ser. No. 17/351,376, filed on Jun. 18, 2021, which claims priority to Chinese Patent Application No. 202011376226.3, filed on Nov. 30, 2020, which is hereby incorporated by reference in its entirety.

FIELD

The present disclosure relates to the field of display, in particular to a nanoparticle, a nanoparticle layer patterning method and related application.

BACKGROUND

Quantum Dots (QDs) are also named as nanocrystalline, are nanometer particles formed by group II-VI or group III-V elements. The particle size of the QDs generally ranges from 1 nm to 20 nm, and electrons and holes are subjected to quantum confinement, so that a continuous energy band structure is changed into a discrete energy level structure, and after being excited, the discrete energy level structure can emit fluorescent light.

With further development of a QD preparation technology, stability and light emitting efficiency of the QDs are continuously promoted, research on a Quantum Light Emitting Diode (QLED) is continuously deepened, and the application prospect of the QLED in the field of display becomes bright increasingly.

SUMMARY

Embodiments of the present disclosure provide a nanoparticle, a nanoparticle layer patterning method and related application.

An embodiment of the present disclosure provides a nanoparticle, including a nanometer particle and a first ligand linked to a surface of the nanometer particle, where the first ligand includes an amino protected by a protective group. The first ligand is configured to dissociate the protective group under an action of a photosensitive material and irradiation of light with a preset wavelength so as to form a second ligand with an amino on the surface of the nanometer particle, and a polarity of the second ligand is different from a polarity of the first ligand; and the amino of the second ligand is cross-linked with an adjacent nanoparticle.

In some embodiments, the protective group includes at least one of tert-butoxycarbonyl,

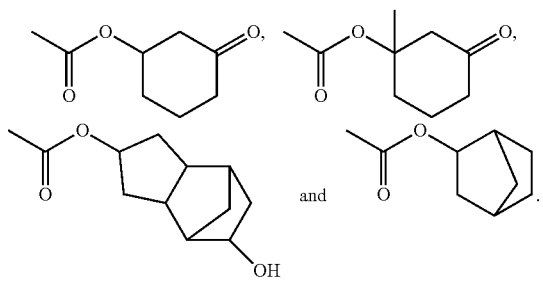

In some embodiments, the first ligand further includes: a linking group linked with the amino protected by the protective group, and a coordinating group linked with the linking group; and the coordinating group is configured to carry out coordinating bonding with the nanometer particle.

In some embodiments, the coordinating group includes at least one of —NH$_2$, —SH, —COOH, —P and —PO$_2$.

In some embodiments, the linking group is (CH$_2$)$_n$, and n is equal to 2 to 6; or, the linking group is of a structure containing a conjugate group, and includes at least one of

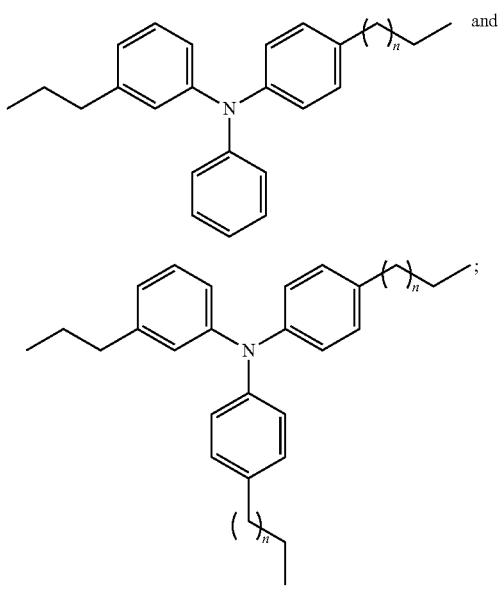

or, the linking group is

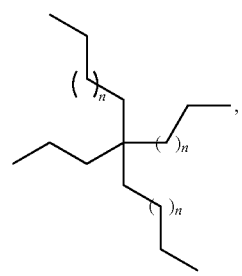

and n is equal to 2 to 6.

In some embodiments, the first ligand includes at least one of

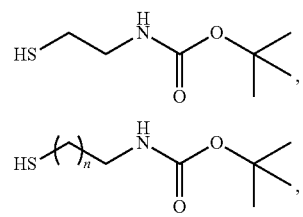

-continued

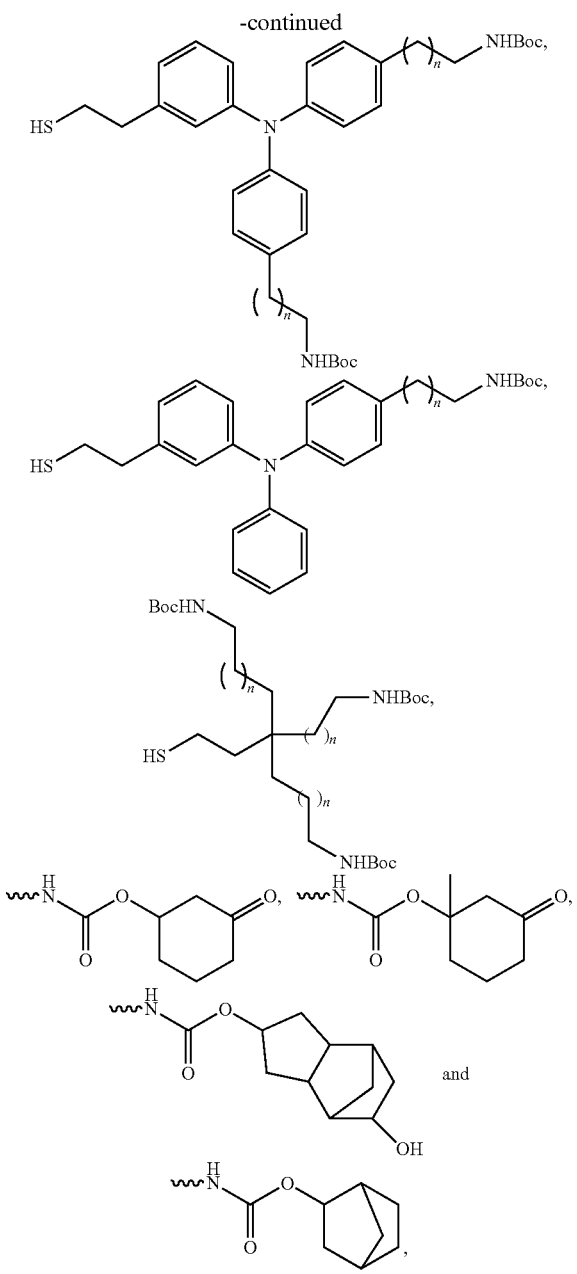

where
Boc represents tert-butoxy carbonyl, and ∿∿∿ represents the linking group linked with the amino and the coordinating group linked with the linking group.

In some embodiments, the nanoparticle includes at least one of CdS, CdSe, ZnSe, InP, PbS, $CsPbCl_3$, $CsPbBr_3$, $CsPbI_3$, CdS/ZnS, CdSe/ZnS, CdSe/ZnSe, InP/ZnS, PbS/ZnS, $CsPbCl_3$/ZnS, $CsPbBr_3$/ZnS, $CsPhI_3$/ZnS, ZnTeSe/ZnSe, ZnO, ZnMgO, ZnAlO and ZnLiO.

An embodiment of the present disclosure further provides a nanoparticle layer patterning method, including: forming a film layer including a photosensitive material and the nanoparticles on a substrate, where the nanoparticles are the above-mentioned nanoparticles provided by the embodiments of the present disclosure; irradiating a reserved region of the film layer by adopting light with a preset wavelength, where a product of the photosensitive material reacts with the first ligand under the irradiation of the light with the preset wavelength to dissociate the protective group, the second ligand with the amino is formed on the surface of the nanometer particle, the polarity of the second ligand is different from the polarity of the first ligand, and the amino of the second ligand is cross-linked with the adjacent nanoparticle; and removing the nanoparticles which are not irradiated by the light with the preset wavelength so as to form a patterned nanoparticle layer in the reserved region.

In some embodiments, the process that the amino of the second ligand is cross-linked with the adjacent nanoparticle is that: the amino of the second ligand is linked with the adjacent nanoparticle under an coordinating action so as to cross-link the nanoparticles together.

In some embodiments, the irradiating the reserved region of the film layer by adopting the light with the preset wavelength includes: shielding the film layer by adopting a mask, where the mask includes a light transmitting region and a light shielding region, and the light transmitting region corresponds to the reserved region irradiated by the light in the film layer.

In some embodiments, the removing the nanoparticles which are not irradiated by the light with the preset wavelength further includes: cleaning the film layer irradiated by the light with the preset wavelength with a solvent, where the nanoparticles in a region, which is not irradiated by the light, in the film layer are dissolved in the solvent, and the nanoparticles in a nanoparticle reserved region are cross-linked and not dissolved in the solvent.

In some embodiments, the photosensitive material is a photo acid generator; and under the irradiation of the light with the preset wavelength. $H^+$ generated by the photo acid generator reacts with the first ligand to dissociate the protective group.

In some embodiments, the photo acid generator includes at least one of sulfonium salt, triazine, sulfonic ester and diazonium salt.

In some embodiments, a mass of the photosensitive material accounts for 1% to 5% of a total mass of the photosensitive material and the nanoparticles.

An embodiment of the present disclosure further provides a method for preparing a light emitting device, including: preparing an anode, a nanoparticle layer and a cathode, where the nanoparticle layer is formed by adopting the above-mentioned nanoparticle layer patterning method provided by the embodiments of the present disclosure.

An embodiment of the present disclosure further provides a light emitting device, including an anode, a nanoparticle layer and a cathode which are laminated. The nanoparticle layer includes a nanometer particle and a second ligand linked to a surface of the nanometer particle, and the second ligand includes: a coordinating group for carrying out coordinating bonding with the nanometer particle, a linking group linked with the coordinating group, and an amino linked with the linking group; and the amino of the second ligand is linked with an adjacent nanoparticle under a coordinating action so as to cross-link the nanoparticles together and form the nanoparticle layer which is of a cross-linked network structure.

An embodiment of the present disclosure further provides a display apparatus, including the above-mentioned light emitting device provided by the embodiments of the present disclosure.

DETAILED DESCRIPTION OF THE EMBODIMENTS

In order to make objects, technical solutions and advantages of the present disclosure more apparent, specific implementation modes of a nanoparticle, a nanoparticle layer patterning method and related application which are provided by the embodiments of the present disclosure will be illustrated in detail below in connection with the drawings.

The embodiments described below with reference to the drawings are exemplary, are merely used for explaining the present disclosure, but cannot be interpreted as limitation to the present disclosure.

Figure 1:
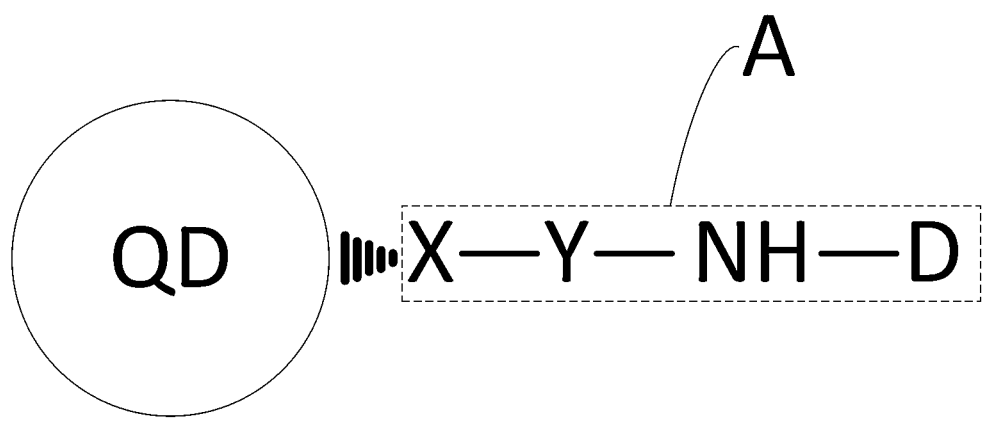
FIG. 1 is a structural schematic diagram of a nanoparticle provided by an embodiment of the present disclosure.

An embodiment of the present disclosure provides a nanoparticle, as shown in FIG. 1, including a nanometer particle (represented by QD) and a first ligand A linked to a surface of the nanometer particle QD, and the first ligand A having an amino (—NH-D) protected by a protective group D.

Figure 2:
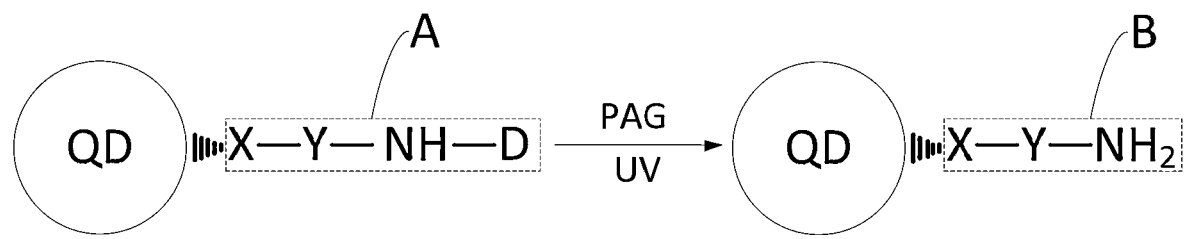
FIG. 2 is a schematic diagram of a reaction mechanism of the nanoparticle shown in FIG. 1 under the action of ultraviolet light and a photo acid generator.

As shown in FIG. 2, the first ligand A is configured to dissociate the protective group D under the action of a photosensitive material (e.g., a photo acid generator PAG, which will be illustrated in detail subsequently) and irradiation of light (e.g., ultraviolet light UV) with a preset wavelength to form an amino (—NH$_2$) so as to form a second ligand B with the amino (—NH$_2$) on the surface of the nanometer particle QD, and a polarity of the second ligand B is different from a polarity of the first ligand A; and the amino (—NH$_2$) of the second ligand B may be cross-linked with the adjacent nanoparticle.

The nanoparticle provided by the embodiments of the present disclosure includes the nanometer particle and the first ligand linked to the surface of the nanometer particle, and the first ligand has the protective group for the amino: when the nanoparticle with the structure is adopted to form a patterned nanoparticle layer on a substrate, the photosensitive material is added in the nanoparticle, then the protective group in the first ligand is dissociated to form the amino under the irradiation of the light with the preset wavelength, the second ligand including the amino is formed on the surface of the nanometer particle, and the polarity of the second ligand is different from that of the first ligand, so the second ligand and the first ligand are different in solubility in the same developing solution; and the cross-linking reaction is performed between the amino of the second ligand and the adjacent nanoparticle so as to form a tightly connected cross-linked network structure. When the developing solution is adopted to carry out developing treatment, the cross-linked nanoparticles are not dissolved in the developing solution and are reserved, and the uncross-linked nanoparticles are dissolved in the developing solution so as to be separated from the substrate to be removed, thereby completing patterning of the nanoparticle layer. Compared with the related art, according to the present disclosure, patterning of the nanoparticle layer may be completed without adopting ink-jet printing, and a nanoparticle pattern with high resolution and excellent performance may be formed. When the nanoparticles are QDs, the resolution of QD patterning may be improved so as to obtain a display apparatus with more excellent display performance.

It should be illustrated that a product in FIG. 2 merely indicates a structure of the nanoparticle with the second ligand B on the surface, certainly, the product further includes other substances, and it will be illustrated in detail later according to a specific first ligand structure.

In some embodiments, as shown in FIG. 2, the amino (—NH$_2$) formed by dissociating the protective group D is a primary amino.

In some embodiments, the light with the preset wavelength may be the ultraviolet light (UV).

In some embodiments, the photosensitive material may be the photo acid generator: and under the irradiation of the light (the ultraviolet light UV) with the preset wavelength. H$^+$ generated by the photo acid generator reacts with the first ligand to dissociate the protective group so as to form the amino.

In some embodiments, the photo acid generator may include at least one of sulfonium salt, triazine, sulfonic ester and diazonium salt.

In some embodiments, the sulfonium salt may be triphenylsulfonium hexafluoroantimonate and the like, the triazine may be (4.6)-bis(trichloromethyl)-1.3.5 triazine derivative and the like, the sulfonic ester may be N-p-toluene sulfonyloxy phthalimide and the like, and the diazonium salt may be diazonium fluoborate and the like.

Illustration will be carried out below by taking a case that the photosensitive material is the photo acid generator and the light with the preset wavelength is the ultraviolet light (UV) as an example.

In some embodiments, the nanoparticle may include, but be not limited to, CdS, CdSe, ZnSe, InP, PbS, CsPbCl$_3$, CsPbBr$_3$, CsPbI$_3$, CdS/ZnS, CdSe/ZnS, CdSe/ZnSe, InP/ZnS, PbS/ZnS, CsPbCl$_3$/ZnS, CsPbBr$_3$/ZnS, CsPhI$_3$/ZnS, ZnTeSe/ZnSe, ZnO, ZnMgO, ZnAlO and ZnLiO, where CdS, CdSe, ZnSe, InP, PbS, CsPbCl$_3$, CsPbBr$_3$, CsPbI$_3$, CdS/ZnS, CdSe/ZnS, CdSe/ZnSe, InP/ZnS, PbS/ZnS, CsPbCl$_3$/ZnS, CsPbBr;/ZnS, CsPhI$_3$/ZnS and ZnTeSe/ZnSe are QDs. The embodiments of the present disclosure are illustrated by taking a case that the nanoparticle is the QD as an example.

In some embodiments, as shown in FIG. 1, the protective group D may include at least one of tert-butoxycarbonyl,

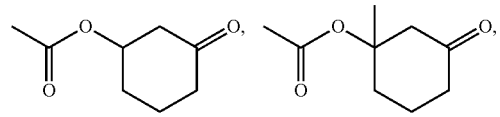

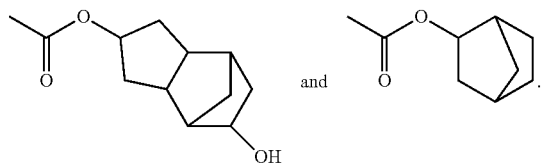

and

In some embodiments, a structural formula of the tert-butoxycarbonyl is

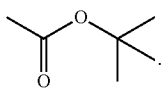

Hydrogen ions are generated after the photo acid generator is irradiated by the ultraviolet light so as to implement deprotection of these protective groups and generate the amino (—NH$_2$), the first ligand has weak polarity, after deprotection of the protective group, the second ligand with strong polarity is generated, and the first ligand and the second ligand are different in solubility in the developing solution; and meanwhile, the generated amino (—NH$_2$) may be linked with the adjacent QD under the coordinating action so as to cross-link the QDs together and form a firm cross-linked network structure, and even may not be dissolved in the developing solution, thus, when patterned QDs are formed, the uncross-linked QDs may be removed by adopting the developing solution, and the cross-linked QDs are reserved.

In some embodiments, the case that the amino (—NH$_2$) is linked with the adjacent QD under the coordinating action means that the amino (—NH$_2$) and metal or a defect on the surface of the adjacent QD form a coordinating bond so as to cross-link the QDs together.

In some embodiments, as shown in FIG. 1, the first ligand A further includes: a linking group Y linked with the amino (—NH-D) protected by the protective group D, and a coordinating group X linked with the linking group Y; and the coordinating group X is configured to carry out coordinating bonding with the nanoparticle QD.

In some embodiments, as shown in FIG. 1, the coordinating group X includes at least one of —NH$_2$, —SH, —COOH, —P and —PO$_2$. In some embodiments, the coordinating group X also may be other groups, which are not listed one by one herein.

In some embodiments, as shown in FIG. 1, the linking group Y may be (CH$_2$)$_n$, and n is equal to 2 to 6:

or, the linking group Y also may be a structure containing a conjugate group, and includes at least one of

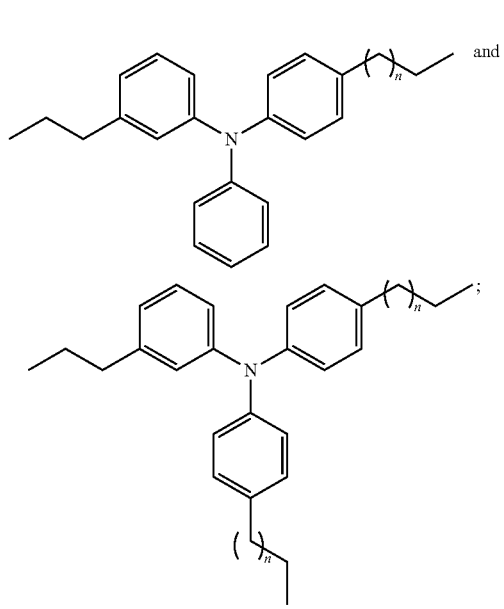

or, the linking group Y also may be

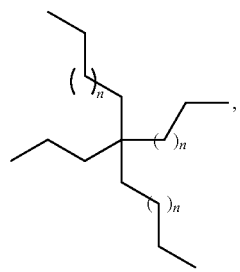

and n is equal to 2 to 6.

In some embodiments, when the linking group adopts the structure containing the conjugate group and the QD is used as a light emitting layer of a light emitting device, the QD may assist in carrier transport and improve performance of the light emitting device.

In some embodiments, when the linking group adopts

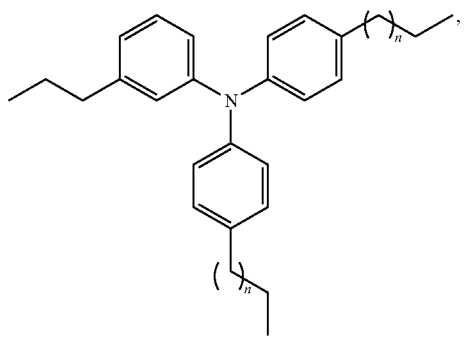

the structure has many cross-linking sites (there are two aminos on one molecule) and is better in solubility, and in the developing process, the uncross-linked QDs are easier to clean out; and the QDs cross-linked on the cross-linking sites are lower in solubility and easier to reserve.

In some embodiments, when the linking group adopts

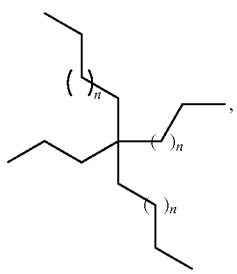, there are more cross-linking sites, and a cross-linked QD film is good in stability; and when the QDs are not cross-linked, the QDs are better in solubility, and the uncross-linked QDs are easier to clean out in the developing process.

In some embodiments, as shown in FIG. 1, the first ligand A includes at least one of

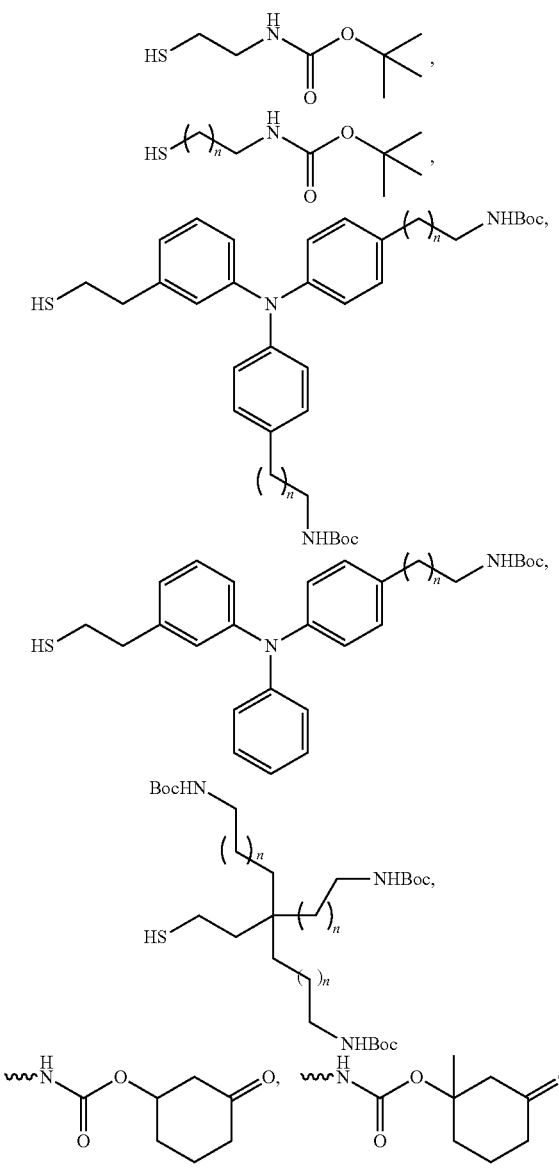

Boc represents tert-butoxycarbonyl, and ∿∿ represents the linking group linked with the amino and the coordinating group linked with the linking group.

A case that the QD is CdSe/ZnSe and the first ligand A is

Figure 3:
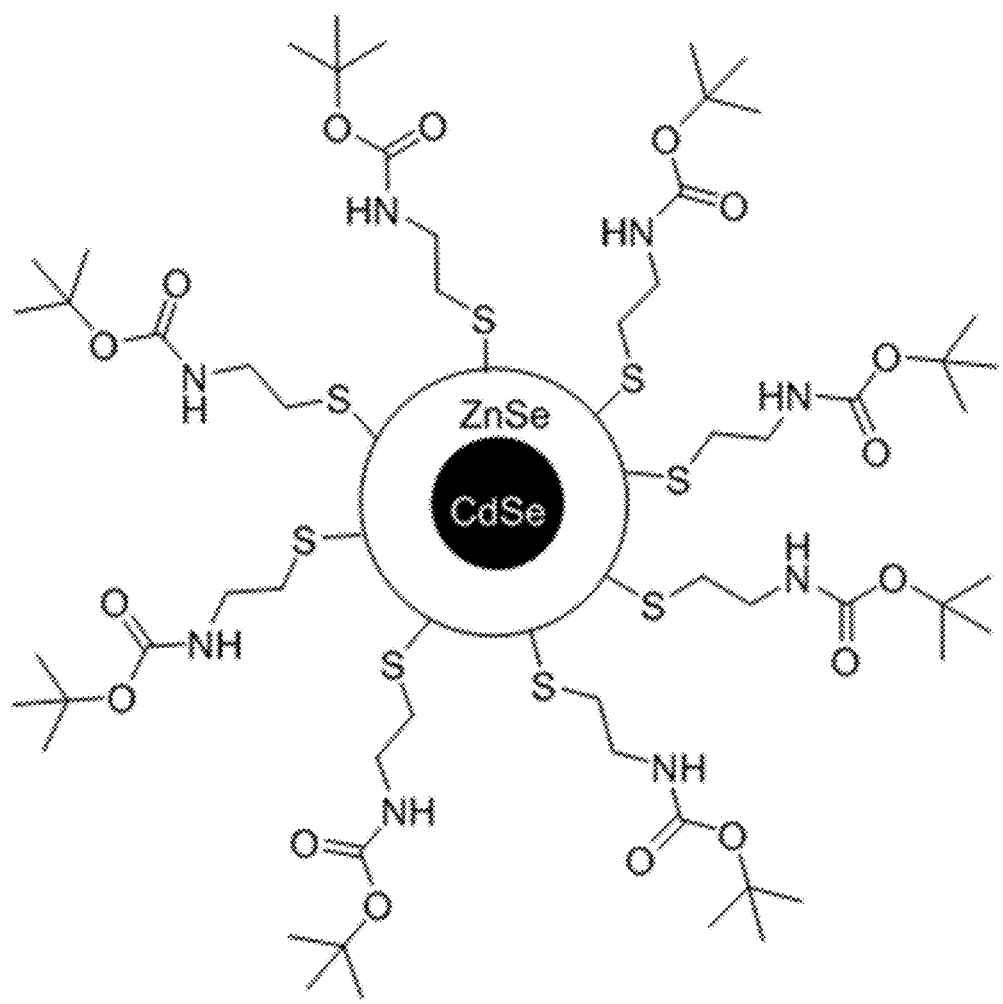
FIG. 3 is a specific structural schematic diagram of a nanoparticle provided by an embodiment of the present disclosure.
Figure 4:
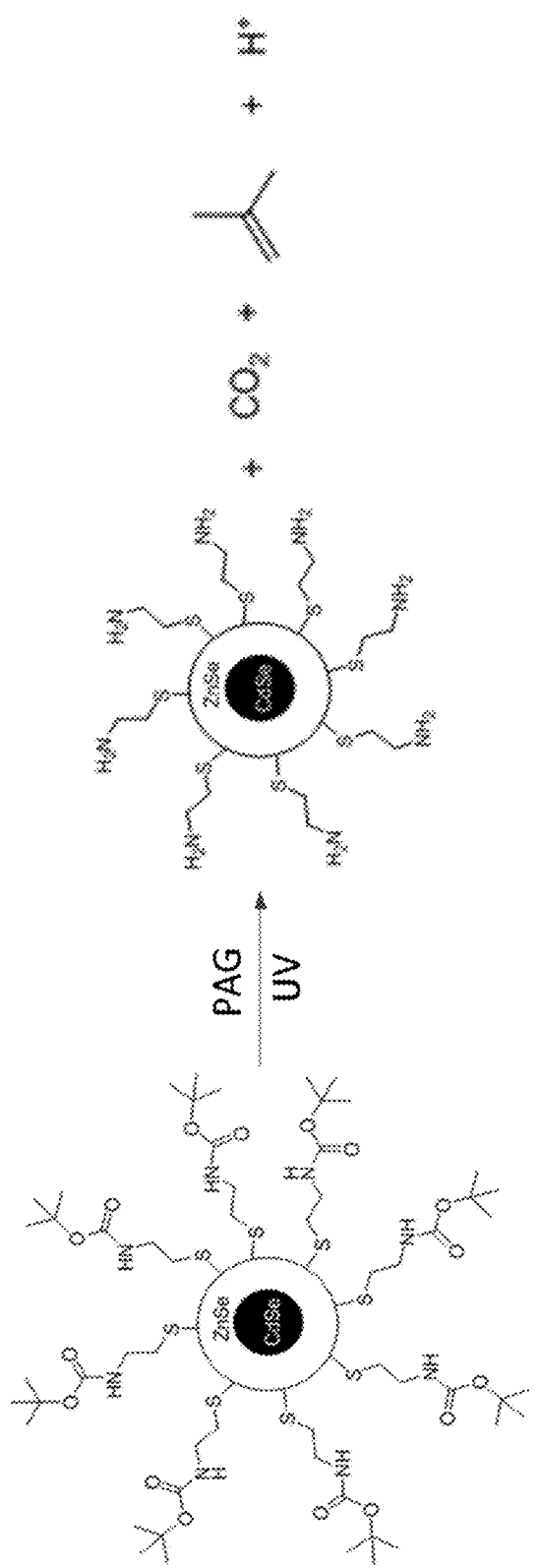
FIG. 4 is a schematic diagram of a reaction mechanism of the nanoparticle shown in FIG. 3 under the action of ultraviolet light and a photo acid generator.

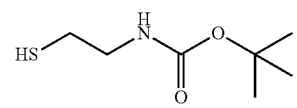

is taken as an example, and the structure of the QD is as shown in FIG. 3; and a deprotection and cross-linking reaction is performed on the QD shown in FIG. 3 under the action of the photo acid generator (represented by PAG) and the ultraviolet light (UV), as shown in FIG. 4, tert-butoxycarbonyl

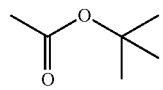

is separated, $CO_2$ and

are generated, and meanwhile, one molecule of $H^+$ is generated.

In some embodiments, the deprotection and cross-linking reaction is performed on the protective group in the embodiments of the present disclosure under the action of the photo acid generator (PAG) and the ultraviolet light (UV), and is a chemical amplified reaction. As shown in FIG. 4, by taking a case that the protective group is tert-butoxycarbonyl ( 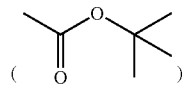 )

as an example, after

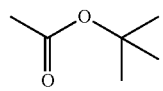

reacts with the photo acid generator (H+) to be removed, one molecule of H+ may be generated again, so that the reaction may be continuously performed. Therefore, the amount of the photo acid generator required in a nanoparticle system is smaller, that is, photosensitiveness is higher, and use and exposure dose of the photo acid generator may be reduced so as to benefit for keeping stability of the QDs.

In addition, as shown in FIG. 4, after an amino deprotection reaction is performed on the first ligand

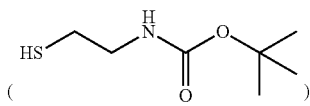

in the embodiments of the present disclosure, only the protective group

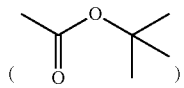

is separated, but the generated second ligand

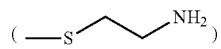

is not separated, so that the defect of the surface of the QD is coated and passivated by the second ligand

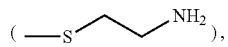

and the device efficiency when the QD is used as the light emitting layer of the light emitting device is not influenced.

Figure 5:
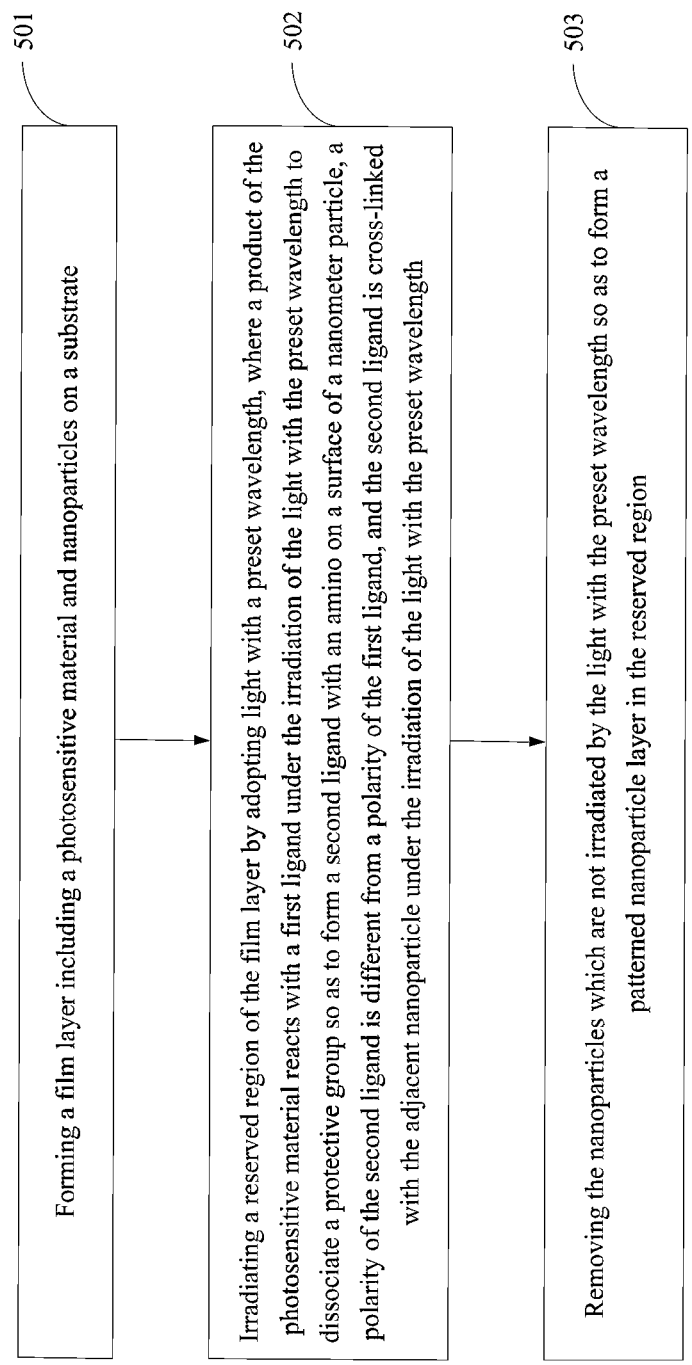
FIG. 5 is a flow chart of a production method of a nanoparticle layer patterning method provided by an embodiment of the present disclosure.

An embodiment of the present disclosure further provides a nanoparticle layer patterning method, as shown in FIG. 5, including S501, S502 and S503.

S501: a film layer including a photosensitive material and nanoparticles is formed on a substrate, where the nanoparticles are the above-mentioned nanoparticles provided by the embodiments of the present disclosure.

S502: a reserved region of the film layer is irradiated by adopting light with a preset wavelength, where a product of the photosensitive material reacts with a first ligand under the irradiation of the light with the preset wavelength to dissociate a protective group so as to form a second ligand with an amino on a surface of a nanometer particle, a polarity of the second ligand is different from a polarity of the first ligand, and the amino of the second ligand is cross-linked with the adjacent nanoparticle.

S503: the nanoparticles which are not irradiated by the light with the preset wavelength are removed so as to form a patterned nanoparticle layer in the reserved region.

According to the nanoparticle layer patterning method provided by the embodiments of the present disclosure, when the patterned nanoparticle layer is formed on the substrate, the photosensitive material is added in the nanoparticles, then the protective group in the first ligand is dissociated to form the amino under the irradiation of the light with the preset wavelength, the second ligand including the amino is formed on the surface of the nanometer particle, and the polarity of the second ligand is different from that of the first ligand, so the second ligand and the first ligand are different in solubility in the same developing solution; and the cross-linking reaction is performed between the amino of the second ligand and the adjacent nanoparticle so as to form a tightly connected cross-linked network structure. When the developing solution is adopted to carry out developing treatment, the cross-linked nanoparticles are not dissolved in the developing solution and are reserved, and the uncross-linked nanoparticles are dissolved in the developing solution so as to be separated from the substrate to be removed, thereby completing patterning of the nanoparticle layer. Compared with the related art, according to the present disclosure, patterning of the nanoparticle layer may be completed without adopting ink-jet printing, and the nanoparticle with high resolution and excellent performance and a pattern thereof may be formed. When the nanoparticles are QDs, the resolution of QD patterning may be improved so as to obtain a display apparatus with more excellent display performance.

In some embodiments, in the patterning method provided by the embodiment of the present disclosure, the process that the amino of the second ligand is cross-linked with the adjacent nanoparticle specifically is that: the amino of the second ligand is linked with the adjacent nanoparticle under the coordinating action so as to cross-link the nanoparticles together. In some embodiments, by taking a case that the nanoparticle is the QD as an example, the surface of the QD has coordinating metal and defect sites, the amino of the second ligand may be subjected to coordinating bonding with metal and defects on the surface of the QD so as to cross-link the QDs together to form the cross-linked network structure.

In some embodiments, in order to enable the QDs in the patterned QD layer to be tightly coagulated to form the pattern, the patterning method provided by the embodiments of the present disclosure, after the patterned nanoparticle layer is formed, further may include: drying and annealing treatment is carried out on the nanoparticle layer. The dried and annealed nanoparticle layer may be more tightly coagulated. In the specific implementation, process parameters of drying and annealing may be set according to demands of actual production.

Illustration will be carried out below by taking a case that the nanoparticle is the QD, the first ligand is

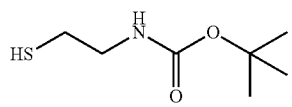

and the photosensitive material is the above-mentioned photo acid generator as an example.

In order to implement full-color display, the QD layer generally includes different colors of patterned QDs, and the embodiments of the present disclosure illustrate the nanoparticle layer patterning method provided by the embodiments of the present disclosure in detail in connection with the drawings by taking a case that the QD layer includes a first QD layer, a second QD layer and a third QD layer as an example.

A QD solution is prepared, and by taking a case that the QD is CdSe/ZnSe as an example, as shown in FIG. 3, the QD has a first ligand on the surface; and the QD is dissolved in normal octane, the obtained product is dispersed into solution with concentration of 30 mg/mL, and different colors of a first QD solution, a second QD solution and a third QD solution are respectively prepared.

In some embodiments, in the patterning method provided by the embodiments of the present disclosure, the step that the film layer including the photosensitive material and the nanoparticles is formed on the substrate specifically includes: a first mixed solution is formed after mixing the photo acid generator and the first QD solution, and then the substrate is coated the first mixed solution to form a first film layer including the photo acid generator and first QDs. Specifically, a mass of the photo acid generator accounts for 1% to 5% of a total mass of the photo acid generator and the QDs. In the specific implementation, the content of the photo acid generator may be set according to actual demands.

Figure 6A:
FIG. 6A to FIG. 6I are structural schematic diagrams of a production method of a nanoparticle layer patterning method provided by an embodiment of the present disclosure after each step is executed.

In some embodiments, as shown in FIG. 6A, the substrate 1 is coated with the first mixed solution in a spin-coating mode to form the first film layer 2.

Figure 6B:
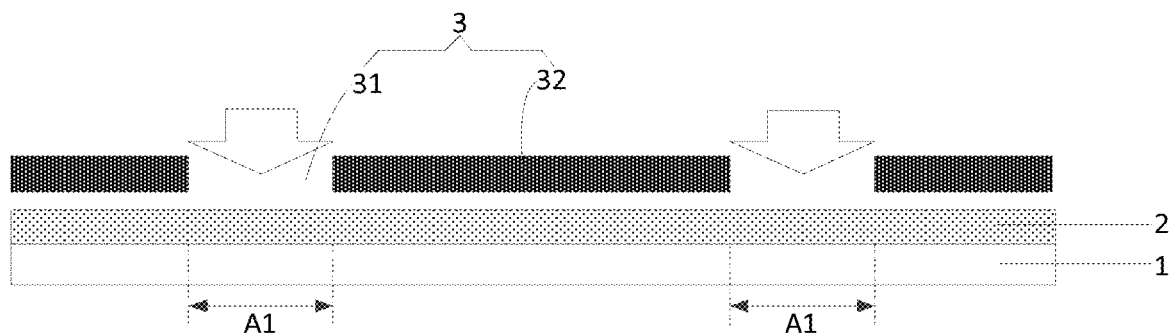

In some embodiments, as shown in FIG. 6B, a first QD reserved region A1 of the first film layer 2 is irradiated by adopting the ultraviolet light (as shown in the arrow direction in the drawing), and the first QD reserved region A1 corresponds to a region where the first QD layer needs to be formed subsequently. In some embodiments, in the patterning method provided by the embodiments of the present disclosure, the first film layer 2 may be irradiated by adopting the ultraviolet light, when the first film layer 2 is irradiated, the first film layer 2 may be shielded by adopting a mask 3, the mask 3 includes a light transmitting region 31 and a light shielding region 32, and the light transmitting region 31 corresponds to the first QD reserved region A1 irradiated by the light in the first film layer 2.

Under the irradiation of the ultraviolet light, the photo acid generator generates H$^+$, as shown in FIG. 4. H$^+$ reacts with the first ligand of the first QD in the first QD reserved region A1 to dissociate the protective group so as to form the amino, the first QD with the second ligand on the surface is generated in the first QD reserved region A1, the amino of the second ligand and the metal or the defect on the surface of the adjacent first QD are subjected to coordinating bonding, and the cross-linked network structure firmly linked with the substrate 1 is formed in the first QD reserved region A1.

In some embodiments, in order to promote the deprotection reaction of

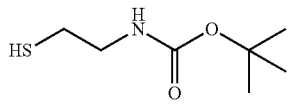

to be completely performed, the exposed substrate 1 may be placed in an environment with the temperature of about 90° C. to be heated for about 120 s.

Figure 6C:

As shown in FIG. 6C, the first film layer 2 irradiated by the light (the ultraviolet light) with the preset wavelength is cleaned with a solvent (e.g., one or mixed solution of many of chloroform, methylbenzene, chlorobenzene, tetrahydrofuran, n-hexane, n-heptane and normal octane), the nanoparticles (the first QDs) in a region, which is not irradiated by the ultraviolet light, in the first film layer 2 are dissolved in the solvent to be cleaned away, and the QDs in the first QD reserved region A1 are cross-linked and not dissolved in the solvent so as to form a patterned first QD layer 21.

Figure 6D:
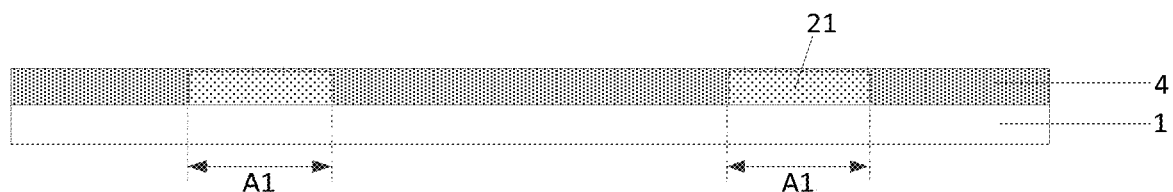

Then, a second mixed solution is formed after the photo acid generator is mixed with a second QD with the first ligand on the surface, as shown in FIG. 6D, the substrate 1 on which the first QD layer 21 is formed is coated with the second mixed solution in a spin-coating mode so as to form a second film layer 4.

Figure 6E:
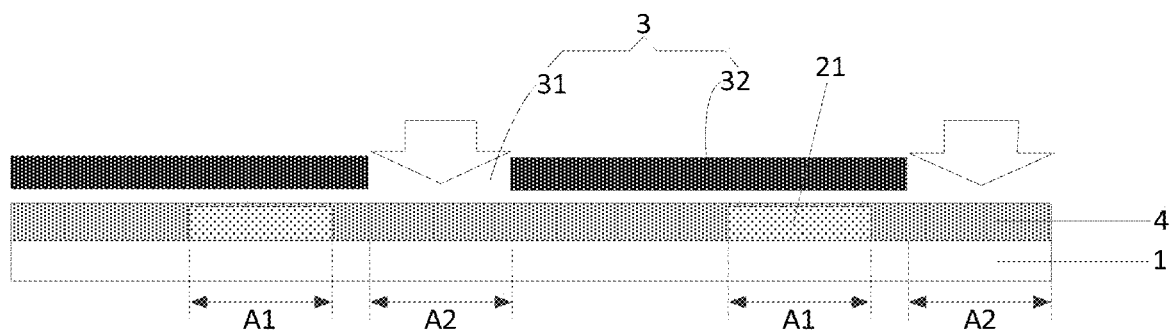

In some embodiments, as shown in FIG. 6E, a second QD reserved region A2 of the second film layer 4 is irradiated by adopting the ultraviolet light (as shown in the arrow direction in the drawing), and the second QD reserved region A2 corresponds to a region where the second QD layer needs to be formed subsequently. In some embodiments, in the patterning method provided by the embodiments of the present disclosure, the second film layer 4 may be irradiated by adopting the ultraviolet light, when the second film layer 4 is irradiated, the second film layer 4 may be shielded by adopting a mask 3, the mask 3 includes a light transmitting region 31 and a light shielding region 32, and the light transmitting region 31 corresponds to the second QD reserved region A2 irradiated by the light in the second film layer 4.

Under the irradiation of the ultraviolet light, the photo acid generator generates H$^+$, as shown in FIG. 4. H$^+$ reacts with the first ligand of the second QD in the second QD reserved region A2 to dissociate the protective group so as to form the amino, the second QD with the second ligand on the surface is generated in the second QD reserved region A2, the second ligand and the metal or the defect on the surface of the adjacent second QD are subjected to coordinating bonding, and the cross-linked network structure firmly linked with the substrate 1 is formed in the second QD reserved region A2.

In some embodiments, in order to promote the deprotection reaction of

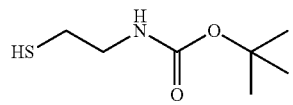

to be completely performed, the exposed substrate 1 in FIG. 6E may be placed in an environment with the temperature of about 90° C. to be heated for about 120 s.

Figure 6F:
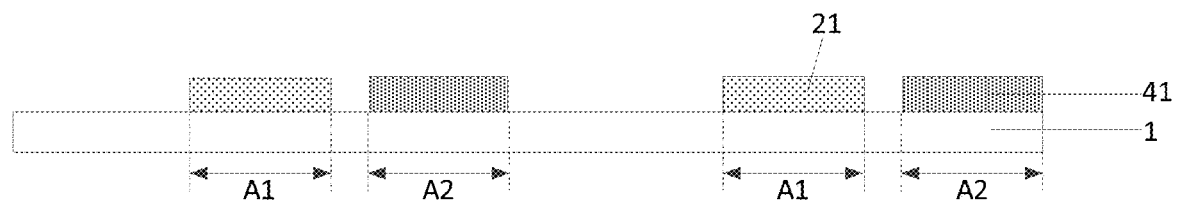

As shown in FIG. 6F, the second film layer 4 irradiated by the light (the ultraviolet light) with the preset wavelength is cleaned with a solvent (e.g., one or mixed solution of many of chloroform, methylbenzene, chlorobenzene, tetrahydrofuran, n-hexane, n-heptane and normal octane), the nanoparticles (the second QDs) in a region, which is not irradiated by the ultraviolet light, in the second film layer 4 are dissolved in the solvent to be cleaned away, and the second QDs in the second QD reserved region A2 are cross-linked and not dissolved in the solvent so as to form a patterned second QD layer 41.

Figure 6G:
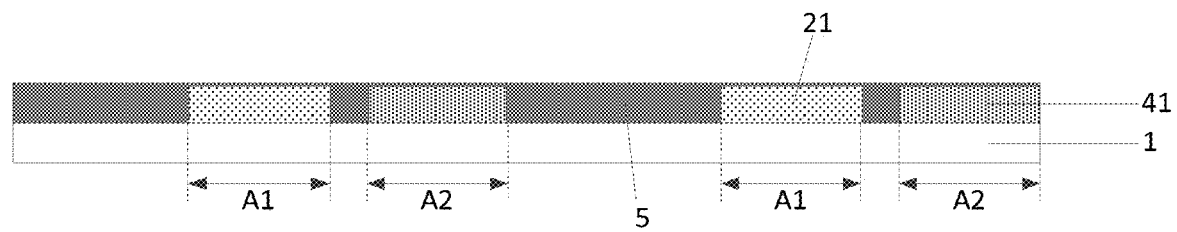

Finally, a third mixed solution is formed after the photo acid generator is mixed with a third QD with the first ligand on the surface, as shown in FIG. 6G, the substrate 1 on which the second QD layer 41 is formed is coated with the third mixed solution in a spin-coating mode so as to form a third film layer 5.

Figure 6H:
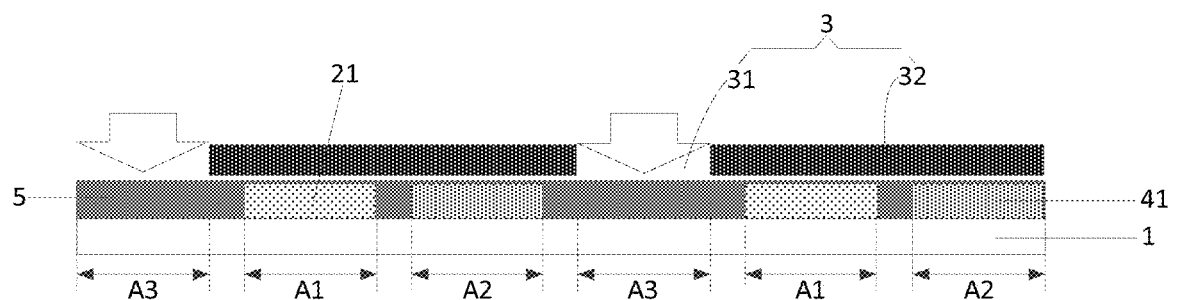

In some embodiments, as shown in FIG. 6H, a third QD reserved region A3 of the third film layer 5 is irradiated by adopting the ultraviolet light (as shown in the arrow direction in the drawing), and the third QD reserved region A3 corresponds to a region where the third QD layer needs to be formed subsequently; and in the specific implementation, in the patterning method provided by the embodiment of the present disclosure, the third film layer 5 may be irradiated by adopting the ultraviolet light, when the third film layer 5 is irradiated, the third film layer 5 may be shielded by adopting a mask 3, the mask 3 includes a light transmitting region 31 and a light shielding region 32, and the light transmitting region 31 corresponds to the third QD reserved region A3 irradiated by the light in the third film layer 5.

Under the irradiation of the ultraviolet light, the photo acid generator generates H$^+$, as shown in FIG. 4. H$^+$ reacts with the first ligand of the third QD in the third QD reserved region A3 to dissociate the protective group so as to form the amino, the third QD with the second ligand on the surface is generated in the third QD reserved region A3, the second ligand and the metal or the defect on the surface of the adjacent third QD are subjected to coordinating bonding, and the cross-linked network structure firmly linked with the substrate 1 is formed in the third QD reserved region A3.

In some embodiments, in order to promote the deprotection reaction of

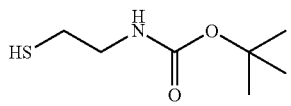

to be completely performed, the exposed substrate 1 in FIG. 6H may be placed in an environment with the temperature of about 90° C. to be heated for about 120 s.

Figure 6I:
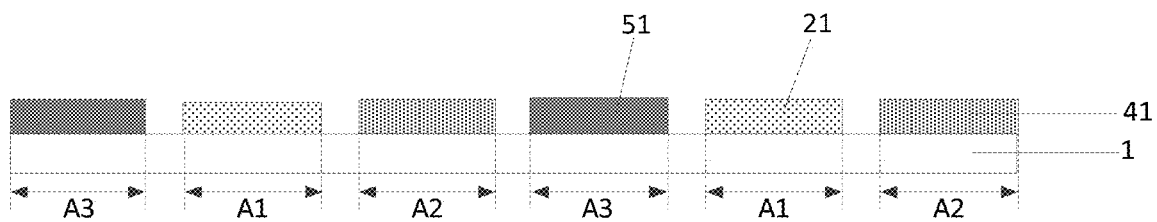

As shown in FIG. 6I, the third film layer 5 irradiated by the light (the ultraviolet light) with the preset wavelength is cleaned with a solvent (e.g., one or mixed solution of many of chloroform, methylbenzene, chlorobenzene, tetrahydrofuran, n-hexane, n-heptane and normal octane), the nanoparticles (the third QDs) in a region, which is not irradiated by the ultraviolet light, in the third film layer 5 are dissolved in the solvent to be cleaned away, and the third QDs in the third QD reserved region A3 are cross-linked and not dissolved in the solvent so as to form a patterned third QD layer 51.

In some embodiments, in the embodiments of the present disclosure, the color of light emitted by the first QD layer, the color of light emitted by the second QD layer and the color of light emitted by the third QD layer respectively are red, green and blue, so the embodiments of the present disclosure complete the patterning process of the full-color QD by the patterning method above. According to the embodiments of the present disclosure, patterning of the QD layer may be completed without adopting ink-jet printing, and the QD with high resolution and excellent performance may be formed.

It should be illustrated that in the process of producing the first QD layer, the second QD layer and the third QD layer which emit different colors of light, the photo acid generator may select the same acid generator, or may select different acid generators, as long as the photo acid generator may generate hydrogen ions under the irradiation of the light with the preset wavelength to react with the protective group.

In some embodiments, the production of the first QD layer, the second QD layer and the third QD layer, as provided by the embodiment of the present disclosure, may adopt the ultraviolet light with the same wavelength to irradiate the first QD reserved region, the second QD reserved region and the third QD reserved region. Certainly, light of an H line also may be adopted to irradiate the first QD reserved region so as to form the first QD layer emitting red light, and a wavelength of the H line is 405 nm: light of an I line may be adopted to irradiate the second QD reserved region so as to form the second QD layer emitting green light, and a wavelength of the I line is 365 nm; and light of a G line may be adopted to irradiate the QD reserved region so as to form the third QD layer emitting blue light, and a wavelength of the G line is 436 nm.

An embodiment of the present disclosure further provides a production method of a light emitting device, including: an anode, a nanoparticle layer and a cathode are produced, wherein the nanoparticle layer (a QD layer) is formed by adopting the above-mentioned nanoparticle layer patterning method.

Figure 7:
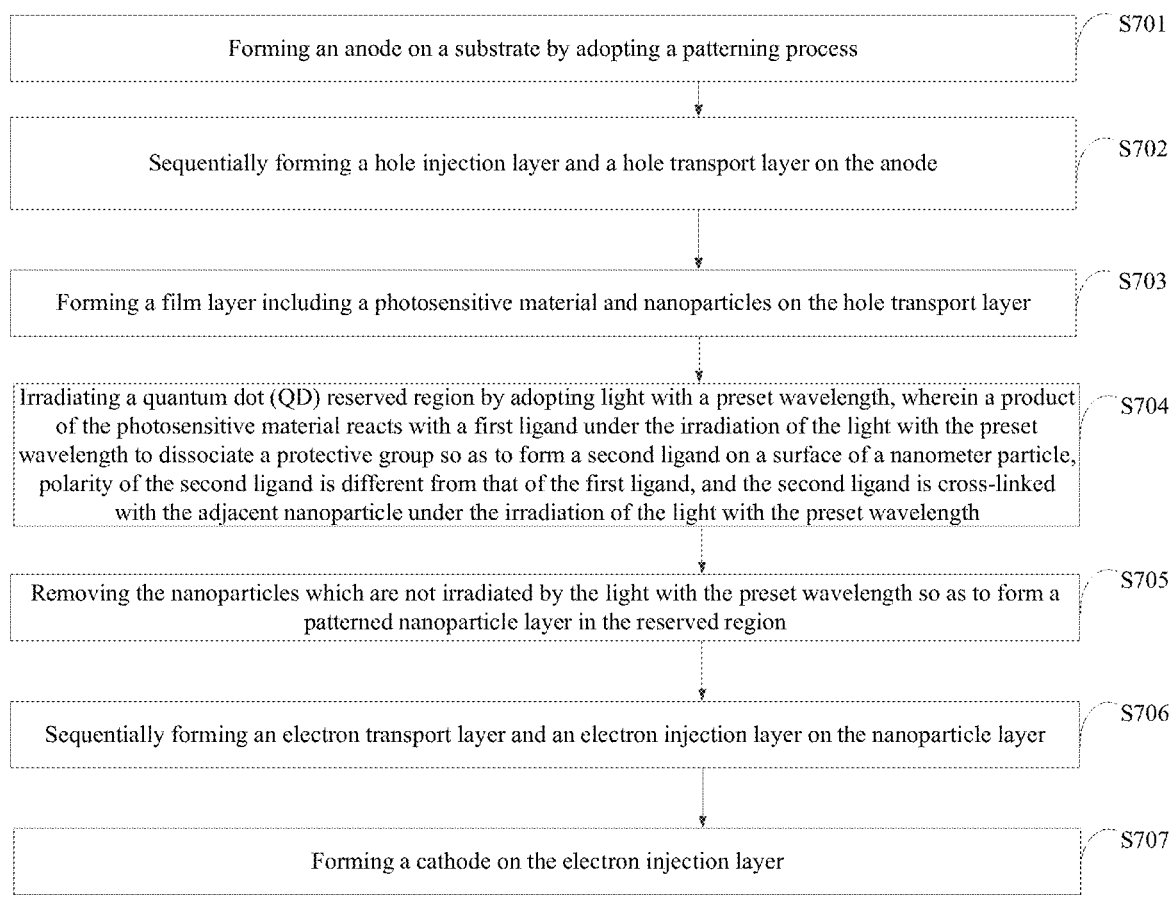
FIG. 7 is a flow chart of a method for preparing a light emitting device provided by an embodiment of the present disclosure.

In some embodiments, the structure of the light emitting device is divided into an upright structure and an inverted structure, and by taking a case that the light emitting device is of an upright structure as an example, forming the light emitting device, as shown in FIG. 7, includes: S701 to S707.

S701: an anode is formed on a substrate by adopting a patterning process.

S702: a hole injection layer and a hole transport layer are sequentially formed on the anode.

S703: a film layer including a photosensitive material and nanoparticles is formed on the hole transport layer.

S704: a QD reserved region is irradiated by adopting light with a preset wavelength, wherein a product of the photosensitive material reacts with a first ligand under the irradiation of the light with the preset wavelength to dissociate a protective group so as to form a second ligand with an amino on a surface of a nanometer particle, polarity of the second ligand is different from that of the first ligand, and the second ligand is cross-linked with the adjacent nanoparticle.

S705: the nanoparticles which are not irradiated by the light with the preset wavelength are removed so as to form a patterned nanoparticle layer in the reserved region.

S706: an electron transport layer and an electron injection layer are sequentially formed on the nanoparticle layer.

S707: a cathode is formed on the electron injection layer.

In some embodiments, specific methods of the steps S701, S702, S706 and S707 provided by the embodiments of the present disclosure are the same with those in the related art, and are not repeated herein; and the steps S703, S704 and S705 are similar with the steps S501, S502 and S503, and are not repeated herein.

In some embodiments, the substrate provided by the embodiments of the present disclosure may include a base substrate, a driving circuit positioned on the base substrate, and structures of a passivation layer, a planarization layer and the like positioned above the driving circuit.

In some embodiments, according to the embodiments of the present disclosure, after production of the cathode is completed, the production method further includes a packaging process, a cutting process and a bonding process of the light emitting device, and those processes are the same with those in the prior art and are not repeated herein.

The production method of the light emitting device with the upright structure, as provided by the embodiments of the present disclosure, will be simply illustrated below in connection with FIG. 8.

First, the substrate 1 is prepared, the base substrate is cleaned by adopting a standard method, then the operations of depositing gate metal (e.g., Mo, a thickness is about 200 nm), carrying out patterning, depositing a gate insulating layer (e.g., a SiO$_2$ material, a thickness is about 150 nm), depositing an active layer (e.g., an IGZO material, a thickness is about 40 nm), carrying out patterning, depositing source-drain metal (e.g., Mo, the thickness is about 200 nm, carrying out patterning, depositing a passivation layer (e.g., a SiO$_2$ material, the thickness is about 300 nm), carrying out patterning, depositing a pixel electrode (e.g., an ITO material, a thickness is about 40 nm) and carrying out patterning are sequentially carried out; and finally, an acrylic material is spin-coated and deposited, and a pixel definition layer with the thickness of about 1.5 um is photoetched and cured so as to form a Thin Film Transistor (TFT) backplane part (i.e., the substrate 1 in the present disclosure).

Figure 8:
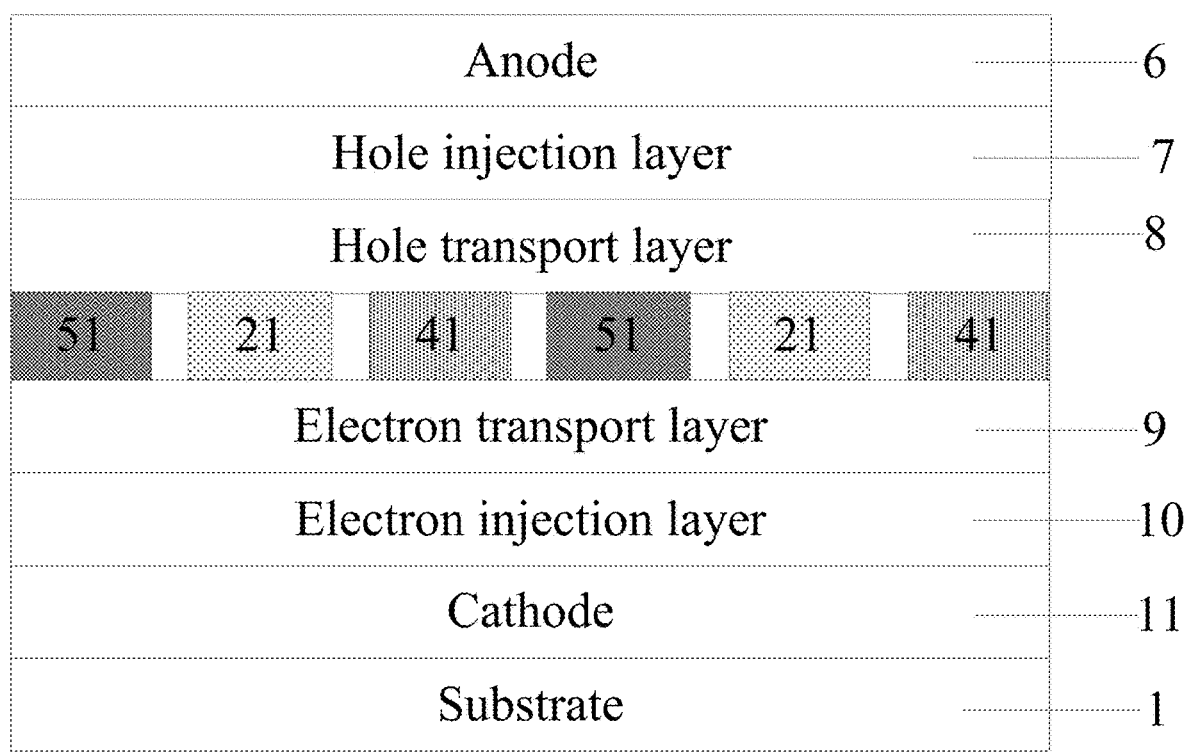
FIG. 8 is an upright structural schematic diagram of a light emitting device provided by an embodiment of the present disclosure.

Then, as shown in FIG. 8, before an anode 6 is formed, the surface of the formed substrate 1 is treated by adopting plasma.

Next, the anode 6 is produced on the substrate 1 by adopting the patterning process, and the production method of the anode 6 is the same with that in the prior art and is not repeated herein.

Then, a hole injection layer 7 is formed on the anode 6 by adopting a spin-coating process, a hole transport layer 8 is formed on the hole injection layer 7 by adopting the spin-coating process, a material of the hole injection layer 7 may be PEDOT:PSS and the like, a material of the hole transport layer 8 may be TFB and the like, and the overall thickness of the hole injection layer 7 and the hole transport layer 8 may be 50 nm to 100 nm; and production methods of the hole injection layer 7 and the hole transport layer 8 are the same with those in the prior art, and are not repeated herein.

Next, a QD layer including a first QD layer 21, a second QD layer 41 and a third QD layer 51 is formed on the hole transport layer 8 by utilizing the nanoparticle layer patterning method.

Then, an electron transport layer 9 and an electron injection layer 10 are sequentially produced on the QD layer by adopting a spin-coating or evaporation process, a material of the electron transport layer 9 may be ZnO nanoparticles and the like, and a material of the electron injection layer 10 may be LiF and the like.

Then, a cathode 11 is evaporated on the electron injection layer 10, a material of the cathode may be LiF:Al and the like, and a thickness of the cathode may be 500 nm to 1,000 nm: and production methods of the electron transport layer 9, the electron injection layer 10 and the cathode 11 are the same with those in the prior art, and are not repeated herein.

Figure 9:
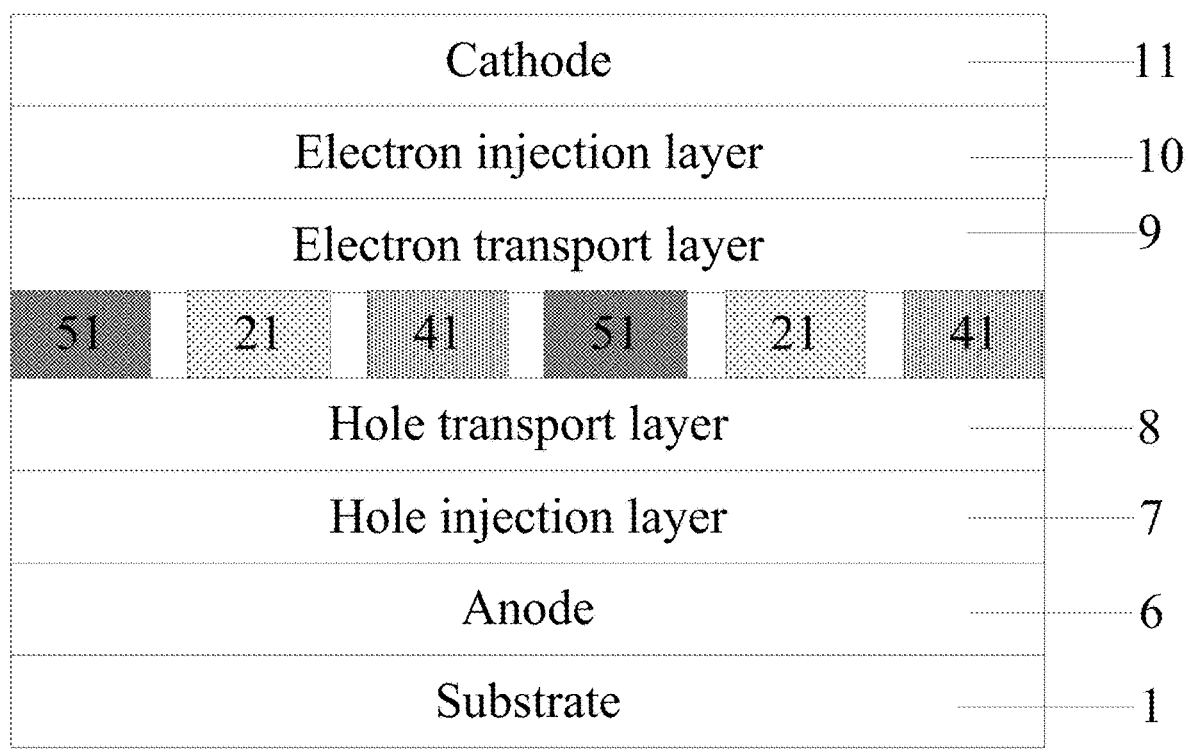
FIG. 9 is an inverted structural schematic diagram of a light emitting device provided by an embodiment of the present disclosure.

It should be illustrated that the embodiment of the present disclosure illustrates the production method of the light emitting device by taking the case that the light emitting device is of the upright structure as the example, and when the light emitting device is of an inverted structure, the difference from the upright structure production is that the inverted structure production includes: the cathode 11, the electron injection layer 10, the electron transport layer 9, the nanoparticle layers (21, 41 and 51), the hole transport layer 8, the hole injection layer 7 and the anode 6 are sequentially formed on the substrate 1, as shown in FIG. 9.

A light emergent mode of the light emitting device formed according to the embodiment of the present disclosure may be a bottom light emergent mode, or may be a top light emergent mode; and a sub-pixel which may be prepared by the present disclosure has the minimum area of 10 to 30 microns and the pixel resolution of about 300 to 800 ppi.

Figure 10:
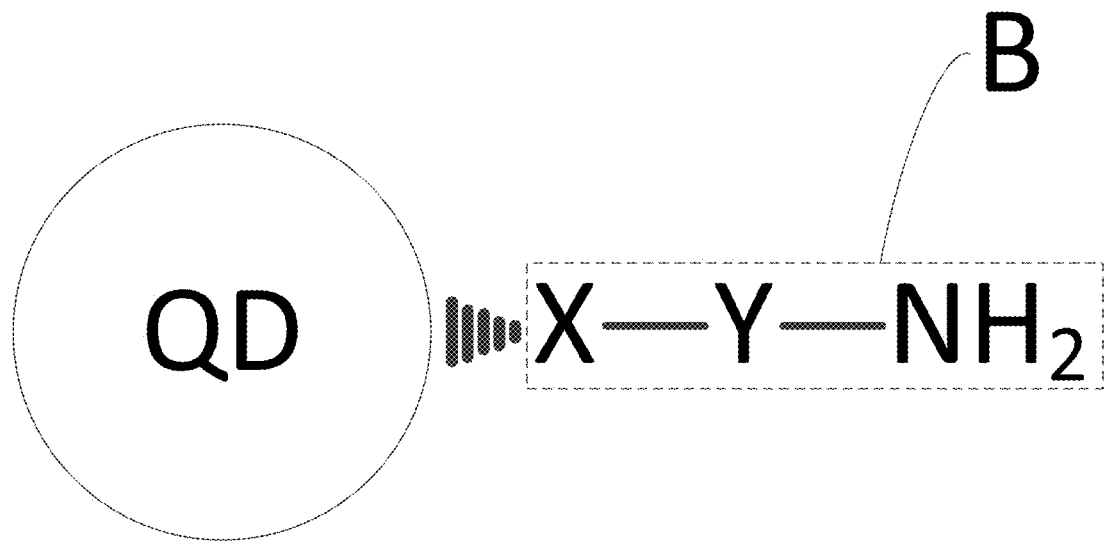
FIG. 10 is a structural schematic diagram of a QD with a second ligand on a surface.

An embodiment of the present disclosure further provides a light emitting device, as shown in FIG. 8 and FIG. 9, including an anode 6, nanoparticle layers (21, 41 and 51) and a cathode 11 which are laminated. As shown in FIG. 10, the nanoparticle layers (21, 41 and 51) include nanometer particles (QDs) and second ligands B linked to the surfaces of the nanometer particles (QDs), and each of second ligands includes: a coordinating group X for carrying out coordinating bonding with the nanoparticles (QDs), a linking group Y linked with the coordinating group X, and an amino (—NH$_2$) linked with the linking group Y; and the amino (—NH$_2$) of each of second ligands B may be linked with the adjacent nanoparticle (QD) under the coordinating action so as to cross-link the nanoparticles together and form the nanoparticle layer which is of a cross-linked network structure.

In some embodiments, the coordinating group X and the linking group Y in FIG. 10 refer to the structures in the contents of the above-mentioned nanoparticle, and are not repeated herein.

An embodiment of the present disclosure further provides a display apparatus, including the above-mentioned light emitting device provided by the embodiment of the present disclosure. The principle that the display apparatus solves the problem is similar with that of the above-mentioned light emitting device, and thus, implementation of the display apparatus may refer to implementation of the above-mentioned light emitting device, and the repeated points are not repeated herein.

In some embodiments, the above-mentioned display apparatus provided by the embodiment of the present disclosure is an organic light emitting display apparatus.

In some embodiments, the above-mentioned display apparatus provided by the embodiment of the present disclosure may be a full-screen display apparatus, or may be a flexible display apparatus and the like, and is not limited herein.

Figure 11:
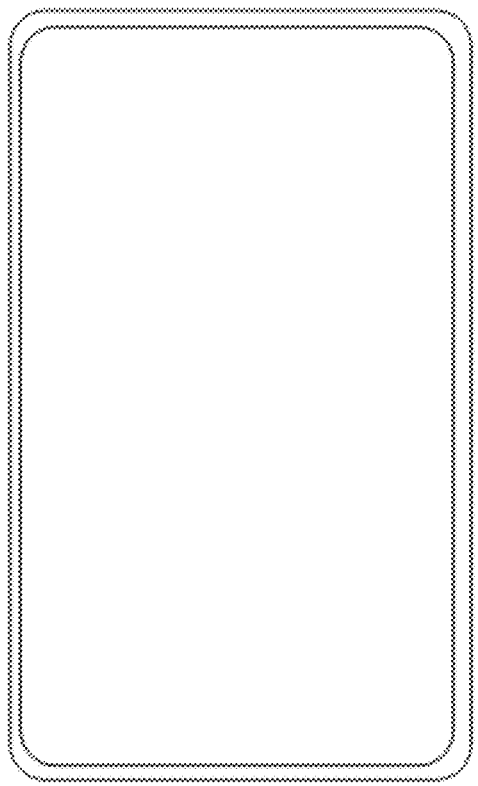
FIG. 11 is a structural schematic diagram of a display apparatus provided by an embodiment of the present disclosure.

In some embodiments, the above-mentioned display apparatus provided by the embodiment of the present disclosure may be a full-screen mobile phone as shown in FIG. 11.

Certainly, the above-mentioned display apparatus provided by the embodiments of the present disclosure also may be any product or part with a display function, such as a tablet personal computer, a television, a display, a notebook computer, a digital photo frame, a navigator and the like. Other essential components of the display apparatus all should be understood by those ordinary skilled in the art, are not repeated herein, and should not be regarded as limitation to the present disclosure.

In some embodiments, the display apparatus provided by the embodiment of the present disclosure further may include other functional film layers familiar to those skilled in the art, which are not illustrated in detail herein.

According to the nanoparticle, the nanoparticle layer patterning method and the related application which are provided by the embodiments of the present disclosure, the nanoparticle provided by the present disclosure includes the nanoparticle and the first ligand linked to the surface of the nanometer particle, and the first ligand has the amino protected by the protective group: when the nanoparticle with the structure is adopted to form the patterned nanoparticle layer on the substrate, the photosensitive material is added in the nanoparticle, then the protective group in the first ligand is dissociated to form the amino under the irradiation of the light with the preset wavelength, the second ligand including the amino is formed on the surface of the nanometer particle, and the polarity of the second ligand is different from that of the first ligand, so the second ligand and the first ligand are different in solubility in the same developing solution; and the cross-linking reaction can be performed between the amino of the second ligand and the adjacent nanoparticle so as to form the tightly connected cross-linked network structure. When the developing solution is adopted to carry out developing treatment, the cross-linked nanoparticles are not dissolved in the developing solution and are reserved, and the uncross-linked nanoparticles are dissolved in the developing solution so as to be separated from the substrate to be removed, thereby completing patterning of the nanoparticle layer. Compared with the prior art, according to the present disclosure, patterning of the nanoparticle layer can be completed without adopting ink-jet printing, and the nanoparticle pattern with high resolution and excellent performance can be formed. When the nanoparticles are QDs, the resolution of QD patterning can be improved so as to obtain a display apparatus with more excellent display performance.

It is evident that one person skilled in the art can make various changes or modifications to the present disclosure without departure from the spirit and scope of the present disclosure. Thus, if these changes and modifications to the present disclosure are within the scope of the claims of the present disclosure and equivalent technologies, the present disclosure also intends to include all such changes and modifications within its scope.

What is claimed is:
1. A nanoparticle, comprising:
   a nanometer particle; and
   a first ligand linked to a surface of the nanometer particle, wherein the first ligand comprises an amino protected by a protective group, a linking group linked with the amino protected by the protective group, and a coordinating group linked with the linking group;
   wherein the protective group comprises at least one of: tert-butoxycarbonyl,

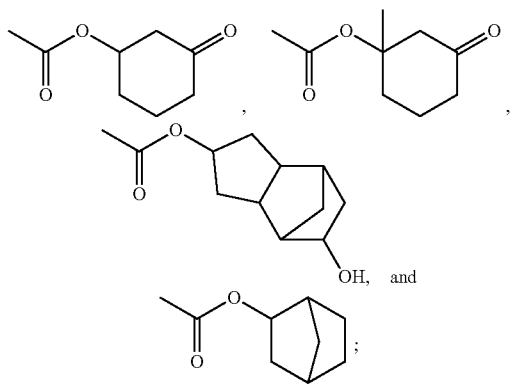

wherein the linking group is $(CH_2)_n$, and n is an integer from 2 to 6; or,
the linking group is of a structure containing a conjugate group, and comprises at least one

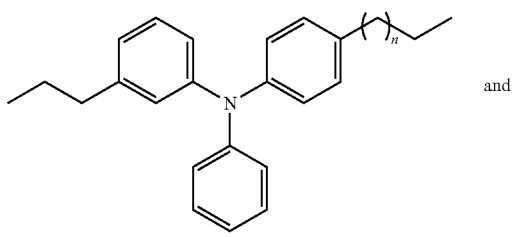

and

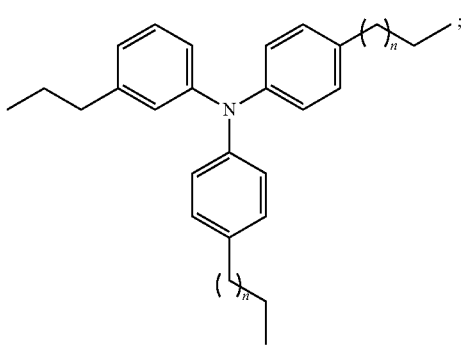

or,
the linking group is

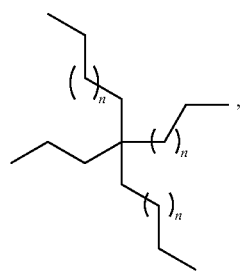

and n is an integer from 2 to 6.

2. The nanoparticle according to claim 1, wherein the coordinating group comprises at least one of: $-NH_2$, $-SH$, $-COOH$, $-P$ and $-PO_2$.

3. The nanoparticle according to claim 1, wherein the first ligand comprises at least one of

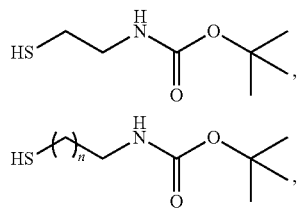

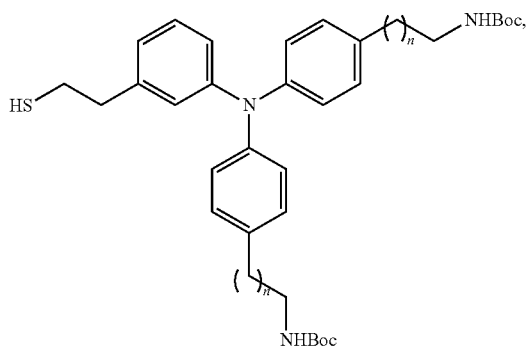

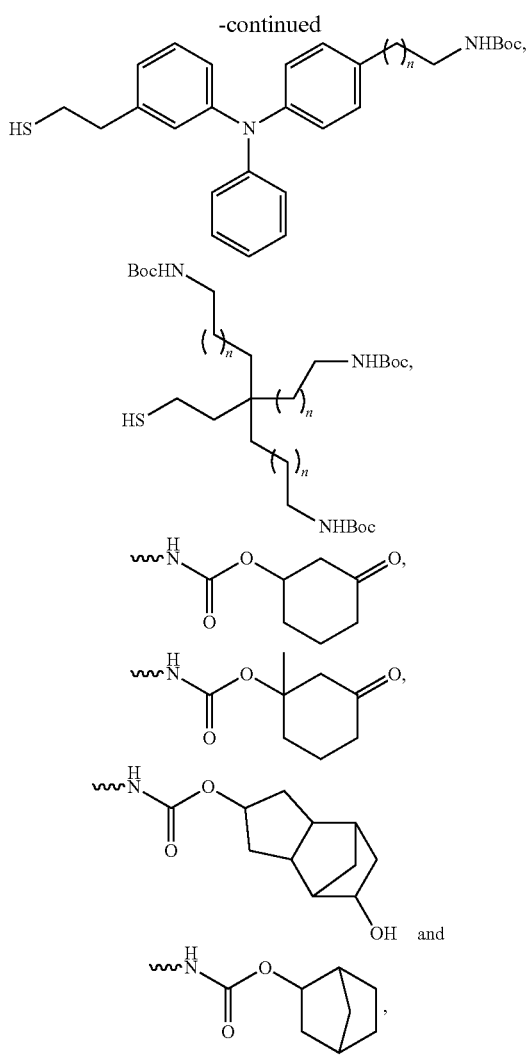

Boc represents tert-butoxycarbonyl, and ⌇⌇⌇ represents the linking group linked with the amino and the coordinating group linked with the linking group.

4. The nanoparticle according to claim 1, wherein the nanometer particle comprises at least one of CdS, CdSe, ZnSe, InP, PbS, $CsPbCl_3$, $CsPbBr_3$, $CsPbI_3$, CdS/ZnS, CdSe/ZnS, CdSe/ZnSe, InP/ZnS, PbS/ZnS, $CsPbCl_3$/ZnS, $CsPbBr_3$/ZnS, $CsPhI_3$/ZnS, ZnTeSe/ZnSe, ZnO, ZnMgO, ZnAlO and ZnLiO.

5. The nanoparticle according to claim 1, wherein the first ligand is configured to dissociate the protective group under an action of a photosensitive material and irradiation of light with a preset wavelength so as to form a second ligand with an amino on the surface of the nanometer particle, and a polarity of the second ligand is different from a polarity of the first ligand.

6. A nanoparticle layer patterning method, comprising:
forming a film layer comprising the nanoparticles according to claim 1 on a substrate;
irradiating a reserved region of the film layer by adopting light with a preset wavelength; and
removing nanoparticles which are not irradiated by the light with the preset wavelength so as to form a patterned nanoparticle layer in the reserved region.

7. The patterning method according to claim 6, wherein the film layer further comprises a photosensitive material; wherein a product of the photosensitive material reacts with the first ligand under irradiation of the light with the preset wavelength to dissociate the protective group, a second ligand with an amino is formed on the surface of the nanometer particle, and a polarity of the second ligand is different from a polarity of the first ligand.

8. The patterning method according to claim 7, wherein the photosensitive material is a photo acid generator; and
under the irradiation of the light with the preset wavelength, $H^+$ generated by the photo acid generator reacts with the first ligand to dissociate the protective group.

9. The patterning method according to claim 8, wherein the photo acid generator comprises at least one of sulfonium salt, triazine, sulfonic ester and diazonium salt.

10. The patterning method according to claim 7, wherein a mass of the photosensitive material accounts for 1% to 5% of a total mass of the photosensitive material and the nanoparticles.

11. The patterning method according to claim 6, wherein the amino of the second ligand is linked with the adjacent nanoparticle under a coordinating action so as to cross-link the nanoparticles together.

12. The patterning method according to claim 6, wherein the irradiating the reserved region of the film layer by adopting the light with the preset wavelength further comprises:
shielding the film layer by adopting a mask, wherein the mask comprises a light transmitting region and a light shielding region, and the light transmitting region corresponds to the reserved region irradiated by the light in the film layer.

13. The patterning method according to claim 6, wherein the removing the nanoparticles which are not irradiated by the light with the preset wavelength further comprises:
cleaning the film layer irradiated by the light with the preset wavelength with a solvent, wherein the nanoparticles in a region, which is not irradiated by the light, in the film layer are dissolved in the solvent, and the nanoparticles in a nanoparticle reserved region are cross-linked and not dissolved in the solvent.

14. A method for preparing a light emitting device, comprising: preparing an anode, a nanoparticle layer and a cathode, wherein the nanoparticle layer is formed by adopting the nanoparticle layer patterning method according to claim 6.

15. A light emitting device, comprising the nanoparticle according to claim 1.

16. The light emitting device according to claim 15, comprising an anode, a nanoparticle layer and a cathode which are laminated, wherein the nanoparticle layer comprises the nanoparticle according to claim 1.

17. A nanoparticle, comprising:
a nanometer particle; and
a first ligand linked to a surface of the nanometer particle, wherein the first ligand comprises an amino protected by a protective group;
wherein the first ligand is configured to dissociate the protective group under an action of a photosensitive material and irradiation of light with a preset wavelength so as to form a second ligand with an amino on the surface of the nanometer particle, and a polarity of the second ligand is different from a polarity of the first ligand.

* * * * *